(12) United States Patent
Chang et al.

(10) Patent No.: US 9,124,246 B2
(45) Date of Patent: Sep. 1, 2015

(54) BASEBAND PROCESSING CIRCUITRY

(71) Applicant: QUALCOMM Incorporated, San Diego, CA (US)

(72) Inventors: Li-Chung Chang, Irvine, CA (US); Bindu Gupta, San Diego, CA (US); Timothy Donald Gathman, San Diego, CA (US); Ibrahim Ramez Chamas, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/037,116

(22) Filed: Sep. 25, 2013

(65) Prior Publication Data

US 2015/0084688 A1  Mar. 26, 2015

(51) Int. Cl.
*H03F 3/45* (2006.01)
*H03H 11/04* (2006.01)
(Continued)

(52) U.S. Cl.
CPC ......... *H03H 11/0466* (2013.01); *H03F 1/0277* (2013.01); *H03F 1/08* (2013.01); *H03F 1/223* (2013.01); *H03F 3/193* (2013.01); *H03F 3/45183* (2013.01); *H03F 3/45475* (2013.01); *H03F 3/45932* (2013.01); *H03F 3/72* (2013.01); *H03F 2200/06* (2013.01); *H03F 2200/09* (2013.01); *H03F 2200/165* (2013.01); *H03F 2200/168* (2013.01); *H03F 2200/171* (2013.01); *H03F 2200/294* (2013.01); *H03F 2200/336* (2013.01); *H03F 2200/411* (2013.01); *H03F 2200/429* (2013.01); *H03F 2200/432* (2013.01); *H03F 2200/534* (2013.01); *H03F 2200/541* (2013.01); *H03F 2200/543* (2013.01); *H03F 2203/45352* (2013.01); *H03F 2203/45396* (2013.01); *H03F 2203/45506* (2013.01); *H03F 2203/45511* (2013.01); *H03F 2203/45512* (2013.01); *H03F 2203/45516* (2013.01);
(Continued)

(58) Field of Classification Search
USPC .................................................. 327/551–555
See application file for complete search history.

(56) References Cited

U.S. PATENT DOCUMENTS 6,862,322 B1    3/2005  Ewen et al.
6,954,090 B2 *  10/2005 Lee et al. ...................... 327/156
(Continued)

OTHER PUBLICATIONS

Darfeuille Sébastien et al., "Silicon-Integrated Differential Bandpass Filters Based on Recursive and Channelized Principles and Methodology to Compute Their Exact Noise Figure," IEEE Transactions on Microwave Theory and Techniques, IEEE Service Center, Piscataway, NJ, US, vol. 54, No. 12, Dec. 1, 2006, pp. 4381-4396, XP011151477, ISSN: 0018-9480, DOI: 10.1109/TMTT.2006.885906.
Partial International Search Report—PCT/US2014/056545—ISA/EPO—Dec. 5, 2014, 8 pages.
International Search Report and Written Opinion—PCT/US2014/056545—ISA/EPO—Feb. 6, 2015, 21 pages.

*Primary Examiner* — An Luu
(74) *Attorney, Agent, or Firm* — Toler Law Group, PC

(57) ABSTRACT

Techniques for designing baseband processing circuitry for radio IC's. In an aspect, techniques for differential-to-single-ended conversion in a baseband portion of the IC are disclosed to reduce the pin count and package size for RF IC's. In another aspect, the converter includes selectable narrow-band and wideband amplifiers, wherein the wideband amplifiers may be implemented using transistor devices having smaller area than corresponding transistor devices of narrow-band amplifiers. Further techniques for bypassing one or more elements, and for implementing a low-pass filter of the converter using an R-C filter network, are described.

25 Claims, 17 Drawing Sheets

(51) Int. Cl.
*H03F 1/02* (2006.01)
*H03F 1/08* (2006.01)
*H03F 1/22* (2006.01)
*H03F 3/193* (2006.01)
*H03F 3/72* (2006.01)

(52) U.S. Cl.
CPC ............... *H03F 2203/45521* (2013.01); *H03F 2203/45522* (2013.01); *H03F 2203/45526* (2013.01); *H03F 2203/45528* (2013.01); *H03F 2203/45594* (2013.01); *H03F 2203/45618* (2013.01); *H03F 2203/45702* (2013.01); *H03F 2203/45728* (2013.01); *H03F 2203/7215* (2013.01); *H03F 2203/7221* (2013.01); *H03F 2203/7236* (2013.01); *H03H 2210/021* (2013.01); *H03H 2250/00* (2013.01)

(56) References Cited

U.S. PATENT DOCUMENTS

| | | | |
|---|---|---|---|
| 7,409,120 | B2 | 8/2008 | Taylor et al. |
| 8,116,677 | B2 | 2/2012 | Rofougaran et al. |
| 8,421,541 | B2 | 4/2013 | Sengupta et al. |
| 8,526,905 | B2 * | 9/2013 | Oliaei et al. .......... 455/323 |
| 8,705,752 | B2 * | 4/2014 | Jiang et al. .......... 381/28 |
| 2005/0237112 | A1 | 10/2005 | Petrovic et al. |
| 2006/0255996 | A1 | 11/2006 | Li et al. |
| 2009/0021307 | A1 | 1/2009 | Tzeng et al. |
| 2010/0144290 | A1 | 6/2010 | Khatri et al. |
| 2013/0069722 | A1 | 3/2013 | Jeong et al. |
| 2013/0295870 | A1 * | 11/2013 | Zhuo et al. .......... 455/326 |

* cited by examiner

BASEBAND PROCESSING CIRCUITRY

BACKGROUND

1. Field

The disclosure relates to baseband processing for integrated circuits.

2. Background

State-of-the-art wireless devices incorporate advanced integrated circuits (IC's) designed for excellent radio performance with small package size. Such IC's may include one or more radio-frequency (RF)/analog IC's coupled to one or more baseband (BB) IC's via a baseband signaling interface, e.g., a plurality of electrical interface pins. The number of required interface pins depends on various aspects of the system design, e.g., on whether the interface signals are differential or single-ended. Furthermore, achieving excellent radio performance mandates the use of efficient and flexible signal processing circuitry, particularly at the baseband level.

It would be desirable to provide effective techniques for improving the performance of baseband circuitry in radio IC's, while reducing their pin count and package size.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Figure 1:
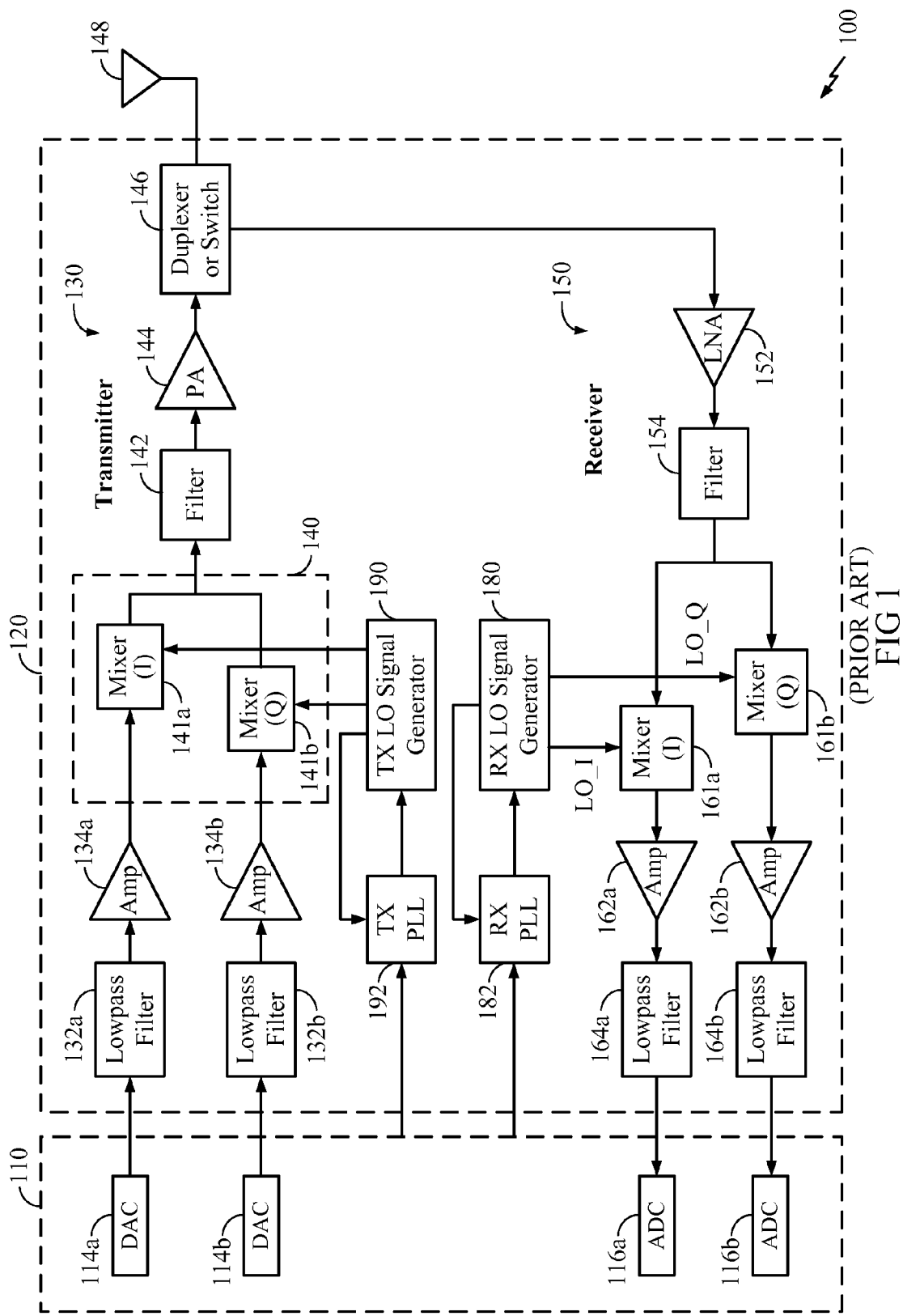
FIG. 1 illustrates a block diagram of a design of a prior art wireless communication device in which the techniques of the present disclosure may be implemented.

FIG. 1 illustrates a block diagram of a design of a prior art wireless communication device 100 in which the techniques of the present disclosure may be implemented. FIG. 1 shows an example transceiver design. In general, the conditioning of the signals in a transmitter and a receiver may be performed by one or more stages of amplifier, filter, upconverter, down-converter, etc. These circuit blocks may be arranged differently from the configuration shown in FIG. 1. Furthermore, other circuit blocks not shown in FIG. 1 may also be used to condition the signals in the transmitter and receiver. Unless otherwise noted, any signal in FIG. 1, or any other figure in the drawings, may be either single-ended or differential. Some circuit blocks in FIG. 1 may also be omitted.

In the design shown in FIG. 1, wireless device 100 includes a transceiver 120 and a data processor 110. The data processor 110 may include a memory (not shown) to store data and program codes. Transceiver 120 includes a transmitter 130 and a receiver 150 that support bi-directional communication. In general, wireless device 100 may include any number of transmitters and/or receivers for any number of communication systems and frequency bands. All or a portion of transceiver 120 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 1, transmitter 130 and receiver 150 are implemented with the direct-conversion architecture.

In the transmit path, data processor 110 processes data to be transmitted and provides I and Q analog output signals to transmitter 130. In the exemplary embodiment shown, the data processor 110 includes digital-to-analog-converters (DAC's) 114a and 114b for converting digital signals generated by the data processor 110 into the I and Q analog output signals, e.g., I and Q output currents, for further processing.

Within transmitter 130, low-pass filters 132a and 132b filter the I and Q analog output signals, respectively, to remove undesired images caused by the prior digital-to-analog conversion. Amplifiers (Amp) 134a and 134b amplify the signals from low-pass filters 132a and 132b, respectively, and provide I and Q baseband signals. An upconverter 140 upconverts the I and Q baseband signals with I and Q transmit (TX) local oscillator (LO) signals from a TX LO signal generator 190 and provides an upconverted signal. A filter 142 filters the upconverted signal to remove undesired images caused by the frequency upconversion as well as noise in a receive frequency band. A power amplifier (PA) 144 amplifies the signal from filter 142 to obtain the desired output power level and provides a transmit RF signal. The transmit RF signal is routed through a duplexer or switch 146 and transmitted via an antenna 148.

In the receive path, antenna 148 receives signals transmitted by base stations and provides a received RF signal, which is routed through duplexer or switch 146 and provided to a low noise amplifier (LNA) 152. The duplexer 146 is designed to operate with a specific RX-to-TX duplexer frequency separation, such that RX signals are isolated from TX signals. The received RF signal is amplified by LNA 152 and filtered by a filter 154 to obtain a desired RF input signal. Downconversion mixers 161a and 161b mix the output of filter 154 with I and Q receive (RX) LO signals (i.e., LO_I and LO_Q) from an RX LO signal generator 180 to generate I and Q baseband signals. The I and Q baseband signals are amplified by amplifiers 162a and 162b and further filtered by low-pass filters 164a and 164b to obtain I and Q analog input signals, which are provided to data processor 110. In the exemplary embodiment shown, the data processor 110 includes analog-to-digital-converters (ADC's) 116a and 116b for converting the analog input signals into digital signals to be further processed by the data processor 110.

In FIG. 1, TX LO signal generator 190 generates the I and Q TX LO signals used for frequency upconversion, while RX LO signal generator 180 generates the I and Q RX LO signals used for frequency downconversion. Each LO signal is a periodic signal with a particular fundamental frequency. A PLL 192 receives timing information from data processor 110 and generates a control signal used to adjust the frequency and/or phase of the TX LO signals from LO signal generator 190. Similarly, a PLL 182 receives timing information from data processor 110 and generates a control signal used to adjust the frequency and/or phase of the RX LO signals from LO signal generator 180.

In the prior art circuitry 100 shown in FIG. 1, transceiver 120 may be coupled to data processor 110 via a plurality of electrical interface pins (not necessarily explicitly shown in FIG. 1). For example, the outputs of low-pass filters 164a, 164b, which may be differential in certain implementations, may be coupled to the inputs of ADC's 116a, 116b through a plurality of interface pins, e.g., two pins for each of filters 164a, 164b. In state-of-the-art wireless devices, it would be desirable to reduce the package size of integrated circuits as well as board size to provide cost-effective solutions. Accordingly, it would be desirable to provide a baseband low-pass filter design having single-ended rather than differential output signals, especially for IC's supporting multiple receiver paths in a single die.

Figure 2:
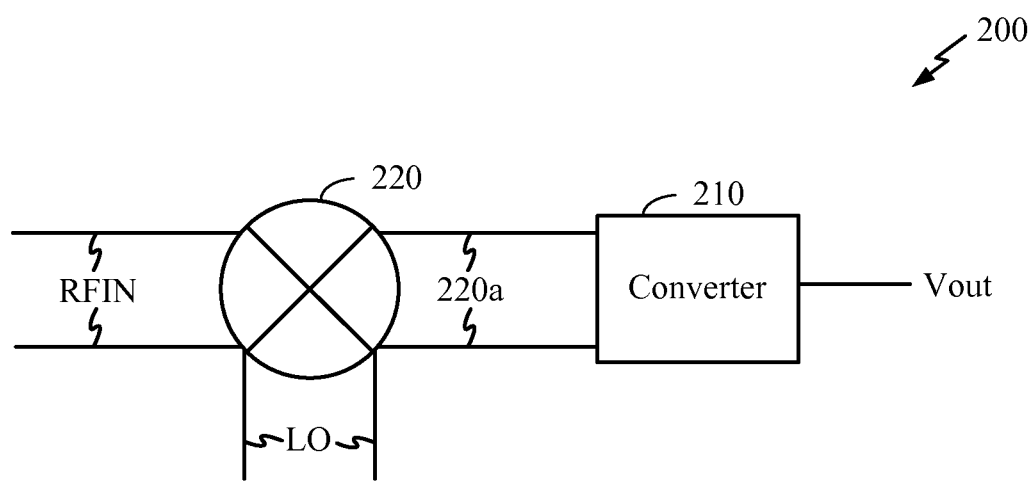
FIG. 2 illustrates an exemplary embodiment of a portion of RF circuitry according to the present disclosure.

FIG. 2 illustrates an exemplary embodiment 200 of a portion of RF circuitry according to the present disclosure. Note FIG. 2 is shown for illustrative purposes only, and is not meant to limit the scope of the present disclosure to any particular exemplary embodiment shown.

In FIG. 2, circuitry 200 includes a mixer 220 and a differential-to-single-ended converter 210. Converter 210 may also be denoted herein as a "baseband amplifier." Mixer 220 mixes a differential radio-frequency input signal (RFIN) with a differential local oscillator input signal (LO) to generate a differential signal 220a, which is provided to the differential input of converter 210. Mixer 220 may be, e.g., an active mixer or a passive mixer, whose operating principles will be clear to one of ordinary skill in the art. It will be appreciated that mixer 220 may correspond to, e.g., the I mixer 161a or Q mixer 161b shown in FIG. 1. Converter 210 generates a single-ended output voltage Vout proportional to differential signal 220a, which may be further coupled to off-chip component circuitry not shown in FIG. 2, e.g., data processor 110.

Figure 3:
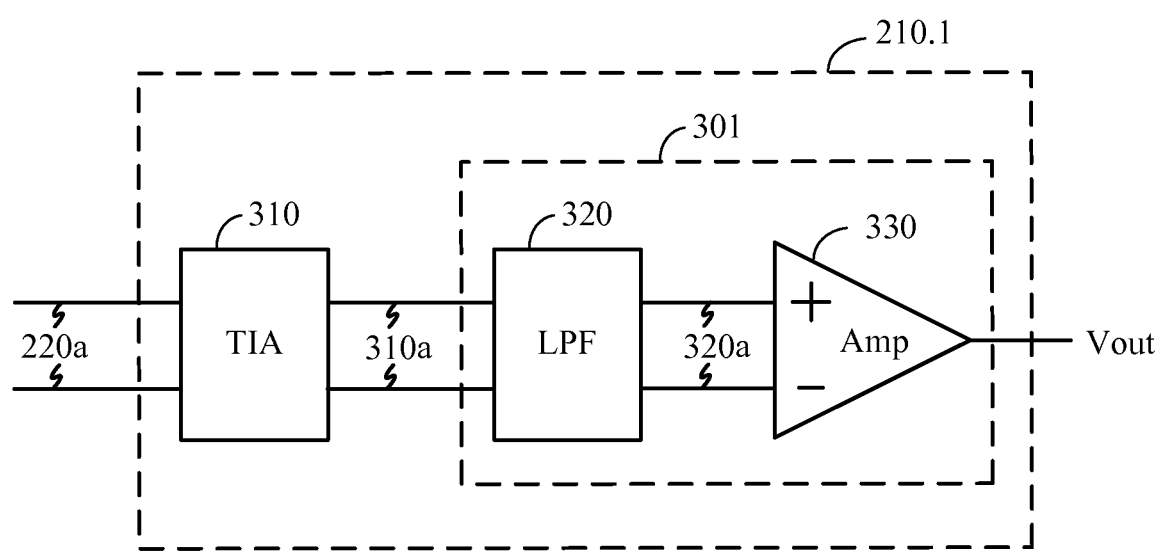
FIG. 3 illustrates an exemplary embodiment of a converter according to the present disclosure.

FIG. 3 illustrates an exemplary embodiment 210.1 of converter 210. Note FIG. 3 is shown for illustrative purposes only, and is not meant to limit the scope of the present disclosure to any particular exemplary embodiment shown.

In FIG. 3, converter 210.1 incorporates a trans-impedance amplifier (TIA) 310, which may convert, e.g., an output current of mixer 220 (not shown in FIG. 3), to a differential output voltage 310a. The TIA 310 may be provided, e.g., in those exemplary embodiments of circuitry 200 wherein mixer 220 is understood to generate an output current. Voltage 310a is further coupled to a processing block 301, which includes a low-pass filter (LPF) 320 and an amplifier (Amp) 330. LPF 320 may attenuate out-of-band jammer signals, thus ensuring that the signal strength is not overly strong such as to degrade the linearity performance of the following circuitry stages. LPF 320 may further present a more balanced impedance to TIA 310, thereby improving the second-order input intercept point (IIP2) performance of TIA 310. Amplifier 330 amplifies a differential output voltage 320a of LPF 320 to generate a single-ended voltage Vout. Based on the description hereinabove, it will be appreciated that processing block 301 may be considered a voltage-to-voltage amplifier.

Note that while converter 210.1 includes TIA 310 as a first block, converter 210 of FIG. 2 generally need not incorporate a trans-impedance amplifier as a first block or any block. For example, alternative exemplary embodiments of mixer 220 in FIG. 2 may generate an output voltage rather than an output current, and no trans-impedance amplifier need be provided at the input of converter 210. Alternatively, if an exemplary embodiment of LPF 320 accepts an input current (rather than an input voltage), then no trans-impedance amplifier need be provided at the input of converter 210, assuming differential signal 220a is a differential output current. In yet alternative exemplary embodiments (not shown), functionality corresponding to any of blocks 310, 320, 330 in FIG. 3 may be integrated into one or more composite functional blocks, according to principles known in the art of circuit design. Such alternative exemplary embodiments are contemplated to be within the scope of the present disclosure.

In certain exemplary embodiments, LPF 320 may be implemented using techniques known in the art for designing low-pass filters, e.g., for designing Butterworth filters, Chebyshev filters, etc. Amplifier 330 may also be implemented using techniques known in the art for designing transistor amplifiers, e.g., common-source (CS) amplifiers, cascode amplifiers, multistage amplifiers, etc. Such alternative exemplary embodiments are contemplated to be within the scope of the present disclosure.

Figure 4:
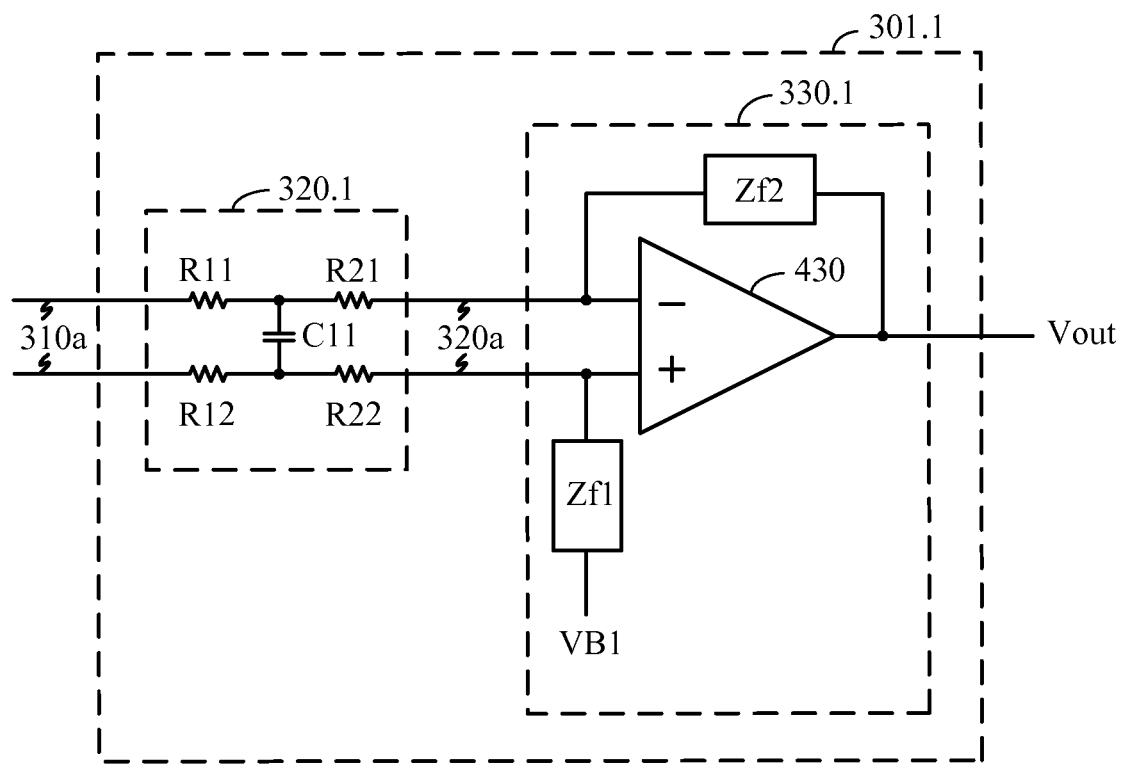
FIG. 4 illustrates an exemplary embodiment of a processing block.

FIG. 4 illustrates an exemplary embodiment 301.1 of processing block 301. Note FIG. 4 is shown for illustrative purposes only, and is not meant to limit the scope of the present disclosure to any particular exemplary embodiments of low-pass filters or amplifiers shown.

In FIG. 4, processing block 301.1 includes an LPF 320.1 and an amplifier 330.1. LPF 320.1 incorporates an R-C network, including resistors R11, R21, R12, R22, and a capacitor C11 coupled in the manner shown. LPF 320.1 filters differential output voltage 310a to generate differential output voltage 320a. It will be appreciated that, in certain exemplary embodiments, LPF 320.1 may present a balanced impedance to the nodes corresponding to voltage 310a at jammer frequencies. It will further be appreciated that, e.g., by appropriately selecting the values of R11, R21, R12, R22, the overall gain of processing block 301.1 may be adjusted.

Amplifier 330.1 incorporates a difference amplifier 430 having positive (+) and negative (−) input terminals coupled to differential output voltage 320a of LPF 320.1. Amplifier 330.1 generates a single-ended voltage Vout, which is proportional to the difference between the positive and negative input voltages of amplifier 430. A first impedance Zf1 further couples the positive input terminal to a bias voltage VB1, while a second impedance Zf2 couples the negative input terminal to Vout. Note that VB1 may correspond, e.g., to a ground voltage or other DC voltage.

One of ordinary skill in the art will appreciate that alternative R-C networks (not shown in FIG. 4) known in the art may be substituted for LPF 320.1. For example, additional R-C circuitry may be serially concatenated with the R-C elements shown in LPF 320.1. Furthermore, additional resistors and capacitors may also be provided in parallel with the R-C circuitry shown in LPF 320.1, as may be readily derived by one of ordinary skill in the art. For example, in an alternative exemplary embodiment (not shown in FIG. 4), further capacitors may couple the opposite nodes of C11 to ground.

In an exemplary embodiment, the resistor values may be symmetrically chosen, e.g., R11 may have the same value as R12 and/or R21 may also have the same value as R22. Alternatively, or in conjunction, any of R11, R21, R12, R22, C11, and/or any other R-C circuitry not shown in FIG. 4 corresponding to LPF 320, may be made programmable to provide dynamic tuning of the frequency response of processing block 301. In particular, programming the resistors and capacitors may allow adjustment of the pole locations and attenuation levels of the LPF according to various applications. Such alternative exemplary embodiments are contemplated to be within the scope of the present disclosure.

It will be appreciated that various techniques for implementing Zf1 and Zf2 will be clear to one of ordinary skill in the art in light of the principles disclosed hereinabove. For example, Zf1 and Zf2 may include passive elements such as resistors, capacitors, inductors, combinations of passive elements, etc., and/or active elements such as transistors, operational amplifiers, combinations of active elements, etc. Such alternative exemplary embodiments are contemplated to be within the scope of the present disclosure.

Figure 5:
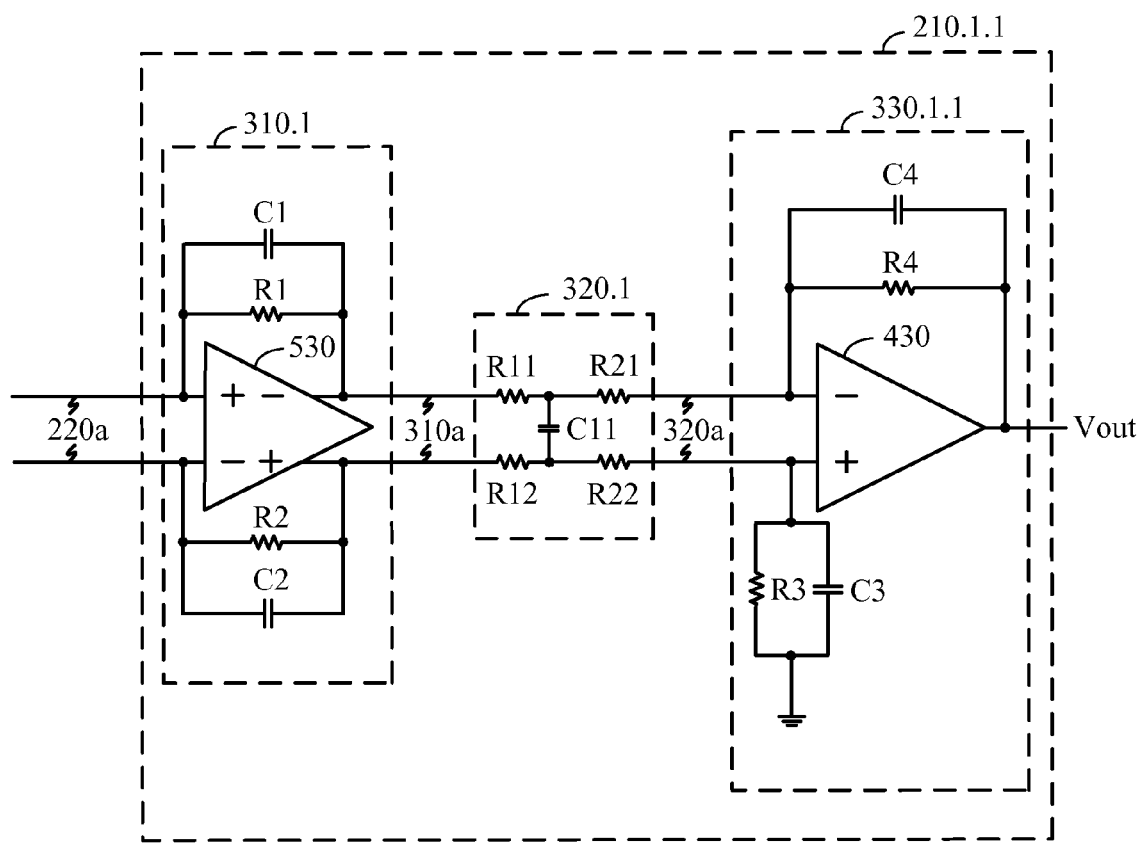
FIG. 5 illustrates an exemplary embodiment of a converter with a detailed description.

FIG. 5 illustrates an exemplary embodiment 210.1.1 of converter 210.1. Note FIG. 5 is shown for illustrative purposes only, and is not meant to limit the scope of the present disclosure to any particular exemplary embodiment shown.

In FIG. 5, converter 210.1.1 includes an exemplary embodiment 310.1 of TIA 310. TIA 310.1 includes a differential amplifier 530 incorporating feedback via parallel R-C circuits (e.g., R1/C1 and R2/C2) from its differential output to its differential input. Differential output voltage 310a of TIA 310.1 is input to LPF 320.1.

Converter 210.1.1 further includes an exemplary embodiment 330.1.1 of amplifier 330.1. Amplifier 330.1.1 includes a parallel R-C circuit (e.g., R3/C3) implementing Zf1 in FIG. 4, and a parallel R-C circuit (e.g., R4/C4) implementing Zf2 in FIG. 4.

Figure 6:
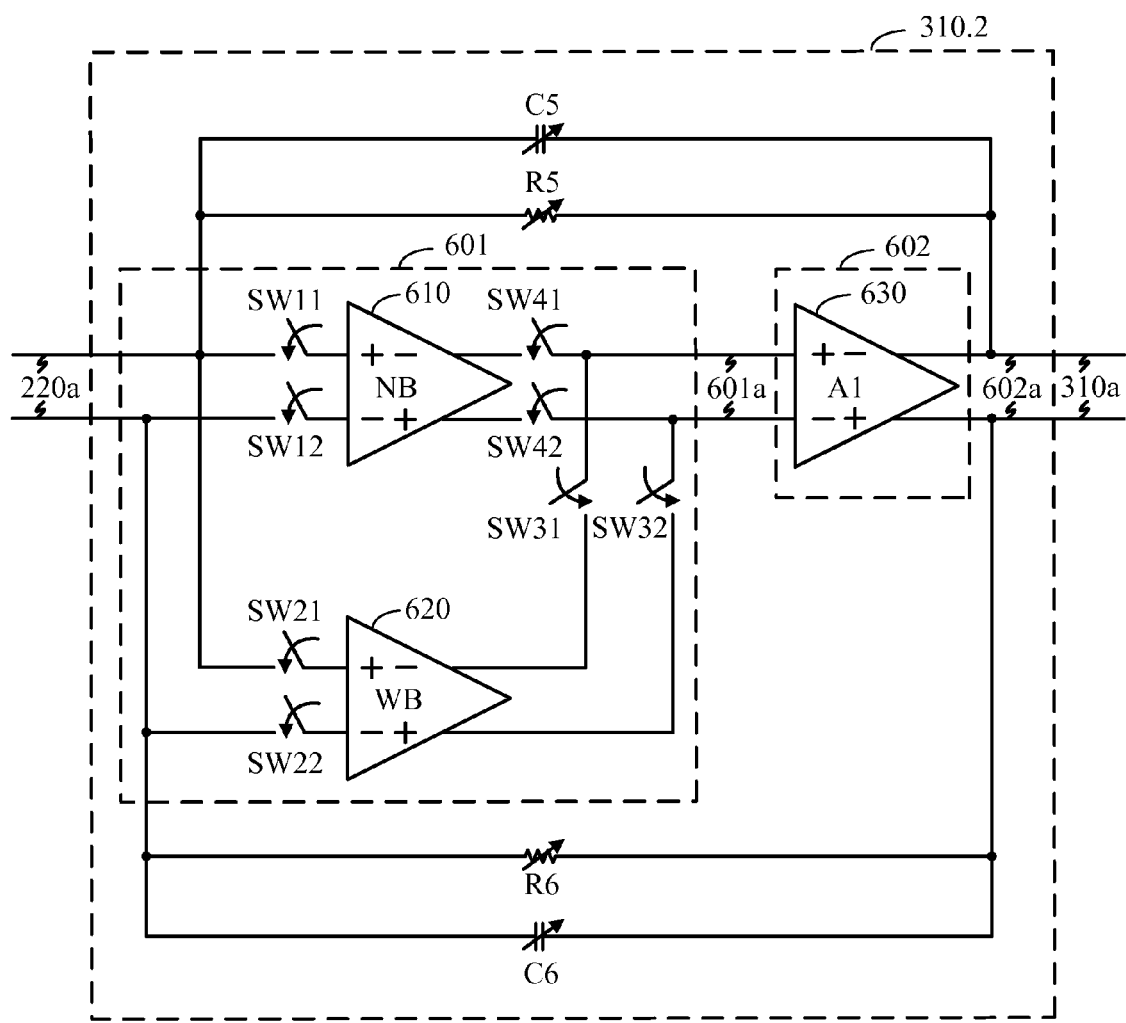
FIG. 6 illustrates an alternative exemplary embodiment of a trans-impedance amplifier.

FIG. 6 illustrates an alternative exemplary embodiment 310.2 of TIA 310. Note FIG. 6 is shown for illustrative purposes only, and is not meant to limit the scope of the present disclosure to any particular exemplary embodiment shown.

In FIG. 6, TIA 310.2 is implemented in two serial stages 601, 602. First stage 601 includes a narrowband (NB) amplifier 610, which has positive (+) and negative (−) input terminals coupled to differential nodes of differential signal 220a via switches SW11 and SW12, respectively. NB amplifier 610 also has positive (+) and negative (−) output terminals coupled to a differential input voltage 601a of second stage 602 via switches SW42 and SW41, respectively.

First stage 601 further includes a wideband (WB) amplifier 620, which has positive (+) and negative (−) input terminals coupled to differential nodes of differential signal 220a via switches SW21 and SW22, respectively. WB amplifier 620 also has positive (+) and negative (−) output terminals coupled to differential input voltage 601a of second stage 602 via switches SW32 and SW31, respectively. Note that NB amplifier 610 and WB amplifier 620 are coupled in parallel, such that the switches shown may be utilized to selectively couple either NB amplifier 610 or WB amplifier 620 to second stage 602.

It will be appreciated that the feature of selectively configuring TIA 310.2 for either narrowband (NB) or wideband (WB) operation advantageously extends the flexibility of the design. In particular, the selection of NB amplifier 610 or WB amplifier 620 allows TIA 310.2 to accommodate a wide range of applications wherein, e.g., noise figure (NF) and bandwidth may be traded off according to the specific performance requirements.

Note alternative exemplary embodiments of two-stage TIA 310.2 may accommodate other switching mechanisms (not shown), e.g., 3-way or other multi-way switches, etc., to select between narrowband and wideband amplifiers. Other alternative exemplary embodiments (not shown) may incorporate more than two amplifiers in first stage 601 coupled in parallel, e.g., covering more than two frequency ranges, such as a mid-band amplifier in addition to narrowband and wideband amplifiers, etc. Other alternative exemplary embodiments (not shown) may readily accommodate more than two stages 601, 602 concatenated in series. Such alternative exemplary embodiments are contemplated to be within the scope of the present disclosure.

Second stage 602 includes amplifier (A1) 630 amplifying a differential input voltage 601a from first stage 601 to generate a differential output voltage 602a, which is coupled to differential output voltage 310a of TIA 310.2. Note feedback R-C circuitry (e.g., R5/C5 and R6/C6) couples differential output voltage 602a of second stage 602 back to the input of first stage 601 to provide trans-impedance gain to TIA 310.2.

In an exemplary embodiment, any elements of the feedback circuitry, e.g., R5, R6, C5, and C6, may be made programmable (as indicated in FIG. 6) to provide dynamic tuning of the frequency response of TIA 310.2. For example, C5 and C6 may be varactors or programmable capacitor banks having variable capacitance. Alternative exemplary embodiments (not shown) may incorporate feedback circuitry having fixed resistance and capacitance values. Such alternative exemplary embodiments are contemplated to be within the scope of the present disclosure.

Note while amplifiers 610, 620, and 630 may be voltage-to-voltage amplifiers, alternative exemplary embodiments (not shown) utilizing a two-stage architecture such as shown for TIA 310.2 may readily be derived in light of the principles described herein. For example, NB amplifier 610 and WB amplifier 620 may alternatively be individually configured as stand-alone trans-impedance amplifiers, e.g., with their own feedback circuitry. Furthermore, in alternative exemplary embodiments, amplifier 630 may be configured as a stand-alone trans-impedance amplifier, in which case NB amplifier 610 and WB amplifier 620 may alternatively be configured as current-to-current amplifiers. Such alternative exemplary embodiments are contemplated to be within the scope of the present disclosure.

Figure 6A:
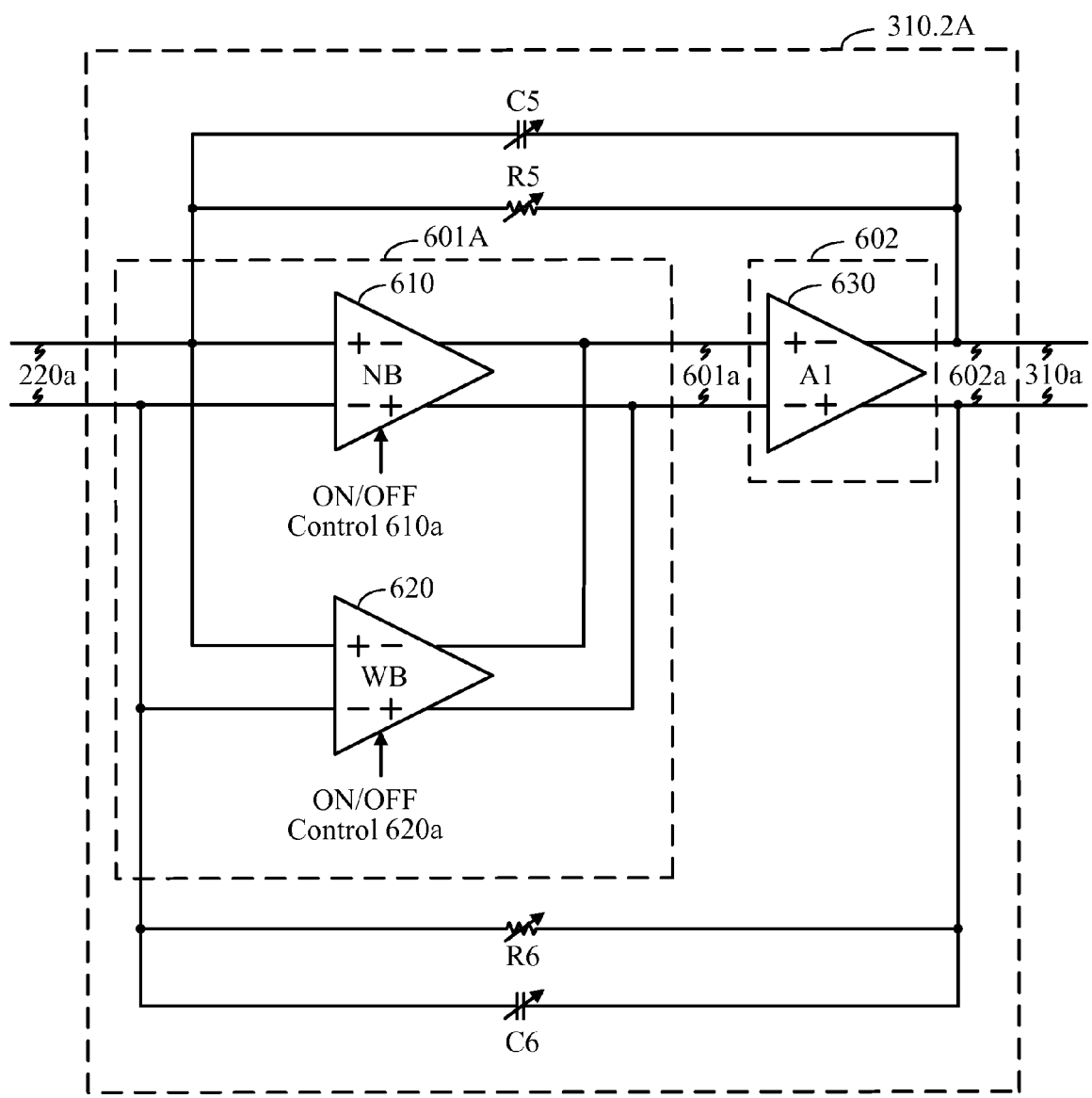
FIG. 6A illustrates an alternative exemplary embodiment of a trans-impedance amplifier having an alternative bandwidth selection mechanism for the first stage.

FIG. 6A illustrates an alternative exemplary embodiment 310.2A of a trans-impedance amplifier having an alternative bandwidth selection mechanism for the first stage 601A. In particular, first stage 601A includes NB amplifier 610 and WB amplifier 620 coupled in parallel, wherein the bandwidth may be selected by appropriately setting ON/OFF Control signal 610a controlling NB amplifier 610 and ON/OFF Control signal 610b controlling WB amplifier 620. For example, to select narrowband operation for first stage 601A, signal 610a may turn on NB amplifier 610, while signal 620a may turn off WB amplifier 620. Similarly, to select wideband operation for first stage 601A, signal 610a may turn off NB amplifier 610, while signal 620a may turn on WB amplifier 620.

It will be appreciated that in alternative exemplary embodiments (not shown), switching techniques may further be combined with the control signal setting techniques shown in FIG. 6A. For example, a set of switches SW11/SW12 may be provided to enable or disable NB amplifier 610, while a control signal 620a may be provided to enable or disable WB amplifier 620. Such alternative exemplary embodiments are contemplated to be within the scope of the present disclosure.

In the exemplary embodiments of FIGS. 6 and 6A described hereinabove, WB amplifier 620 may be implemented using transistor devices having smaller area than corresponding transistor devices of NB amplifier 610. In particular, it will be appreciated that transistors having smaller area will generally have smaller associated parasitic capacitances, and accordingly, may have wider bandwidth. Furthermore, transistors having larger area will generally have reduced 1/f noise and smaller associated input impedances, which may advantageously improve linearity.

For example, in an exemplary embodiment wherein MOS transistors are used to implement such transistor devices, then the product W·L (e.g., W, channel width and L, channel length of MOS transistors) for transistors of NB amplifier 610 may be greater than such product for the transistors of WB amplifier 620. On the other hand, the ratios W/L for transistors in NB amplifier 610 may be equal to the ratios W/L for transistors in WB amplifier 620, or, alternatively, such ratios need not be equal.

Figure 6B:
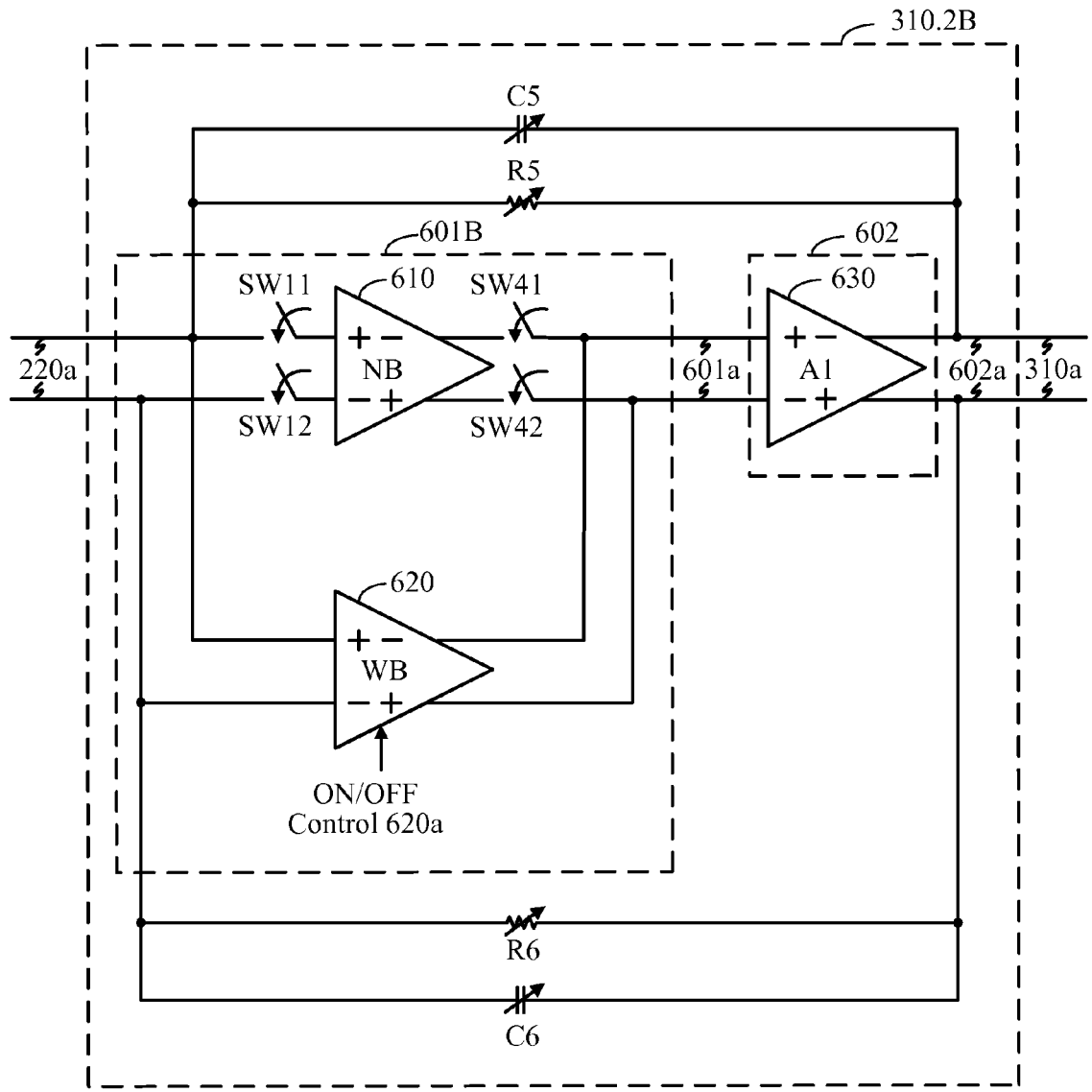
FIG. 6B illustrates an alternative exemplary embodiment of a trans-impedance amplifier having a hybrid bandwidth selection mechanism for the first stage.

FIG. 6B illustrates an alternative exemplary embodiment 310.2B of a trans-impedance amplifier having a hybrid bandwidth selection mechanism for the first stage 601B. In particular, NB amplifier 610 may be turned on or off using switches SW11, SW12, SW41, SW42, while WB amplifier 620 may be turned on or off using ON/OFF control signal 620a. It will be appreciated that for first stage 601B, e.g., larger parasitic capacitances associated with NB amplifier 610 may advantageously be decoupled from the circuitry when NB amplifier 610 is turned off, while the smaller parasitic capacitances associated with WB amplifier 620 when WB amplifier 620 is turned off may be tolerated for the sake of the simpler design associated with providing the control signal 620a.

Figure 7:
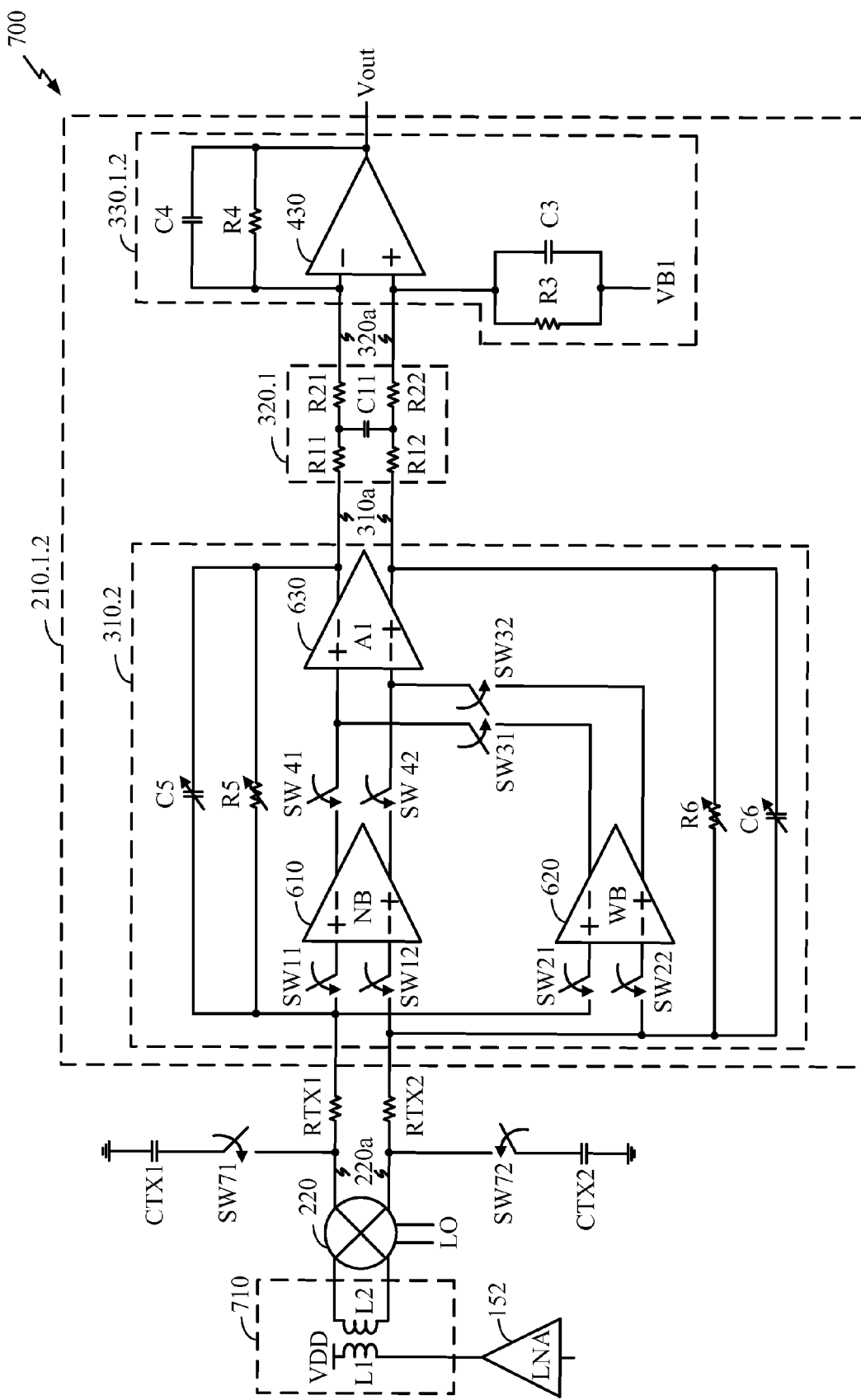
FIG. 7 illustrates an exemplary embodiment of a receiver utilizing techniques according to the present disclosure.

FIG. 7 illustrates an exemplary embodiment 700 of a receiver utilizing techniques according to the present disclosure. Note FIG. 7 is shown for illustrative purposes only, and is not meant to limit the scope of the present disclosure to any particular exemplary embodiment shown.

In FIG. 7, receiver 700 incorporates LNA 152 amplifying a received RF signal input. The output of LNA 152 is coupled to a balun 710, which may include, e.g., a transformer that mutually couples a signal from a primary winding L1 to a secondary winding L2. Balun 710 converts a single-ended output of LNA 152 to a differential RF signal for mixing with a differential LO signal by mixer 220. The differential output signal 220a of mixer 220 is coupled to converter 210.1.2 via an R-C network (e.g., RTX1/CTX1 and RTX2/CTX2), which includes switches SW71 and SW72. In an exemplary embodiment, switches SW71 and SW72 may be opened when wideband (WB) operation is selected. It will be appreciated that the operating principles of the techniques applied to converter 210.1.2 will be clear in light of the description hereinabove with reference to FIGS. 4-6, and thus their description will be omitted hereinbelow.

Figure 8:
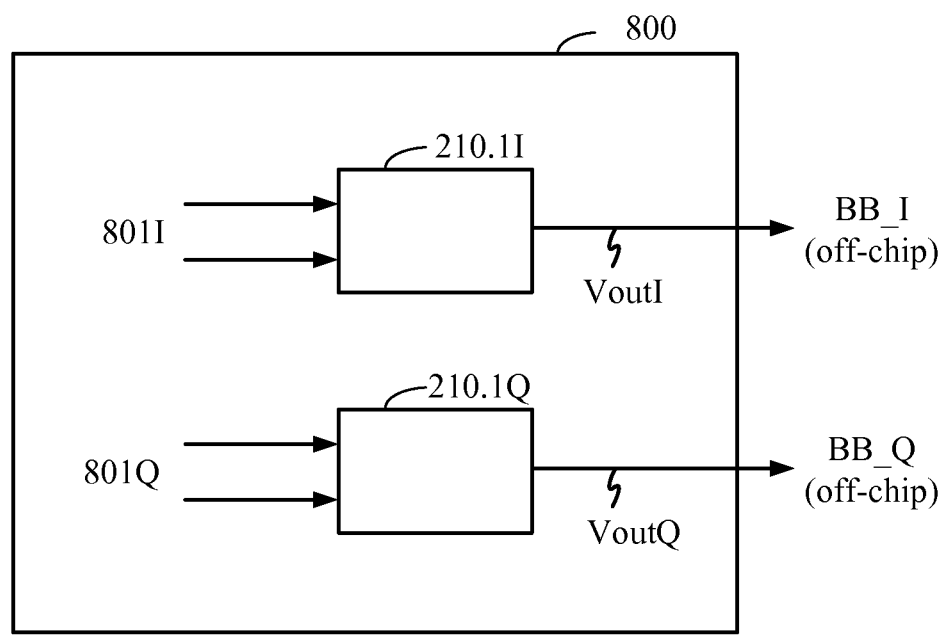
FIG. 8 illustrates an exemplary embodiment of a portion of a transceiver IC accommodating in-phase (I) and quadrature (Q) down-conversion paths utilizing techniques according to the present disclosure.

FIG. 8 illustrates an exemplary embodiment 800 of a portion of a transceiver IC accommodating in-phase (I) and quadrature (Q) down-conversion paths utilizing techniques according to the present disclosure. Note FIG. 8 is shown for illustrative purposes only, and is not meant to limit the scope of the present disclosure to any particular exemplary embodiment shown.

Differential baseband signals 801I, 801Q are provided to differential-to-single-ended converters, 210.1I, 210.1Q, respectively, to generate single-ended voltage outputs VoutI, VoutQ, respectively. Note circuitry for, e.g., down-converting an RF signal to generate the in-phase (I) and quadrature (Q) baseband signals 801I, 801Q is omitted from FIG. 8 for ease of illustration. In an exemplary embodiment, either or both of converters 210.1I, 210.1Q may be implemented using any of the techniques described hereinabove for implementing such converters, e.g., with reference to FIGS. 2 through 7. Note transceiver IC 800 may be provided with one output pin BB_I or BB_Q for each of voltages VoutI and VoutQ, respectively, to interface with other off-chip circuitry, e.g., with a baseband IC including data processor 110 such as shown in FIG. 1. In this manner, the pin count of the transceiver IC 800 may be reduced, thus simplifying the interface between transceiver IC 800 and a baseband IC (not shown in FIG. 8) and further reducing the package size for both IC's.

In certain exemplary embodiments, techniques of the present disclosure may be applied to circuitry designed to support carrier aggregation. For example, to accommodate simultaneous receive processing of four downlink carriers, four separate baseband filter outputs (with each output further including an in-phase I terminal and a quadrature Q terminal) would need to be provided in the interface between the RF and baseband IC's. If each signal is differential, this would result in a total of four (carriers) times four (differential I and Q), or sixteen output pins. By applying the single-ended signal design techniques of the present disclosure to the downconversion signal path for each carrier, only four (carriers) times two (single-ended I and Q), or eight output pins would be needed. The reduction of the output pins by half advantageously reduces package size and cost.

Figure 9:
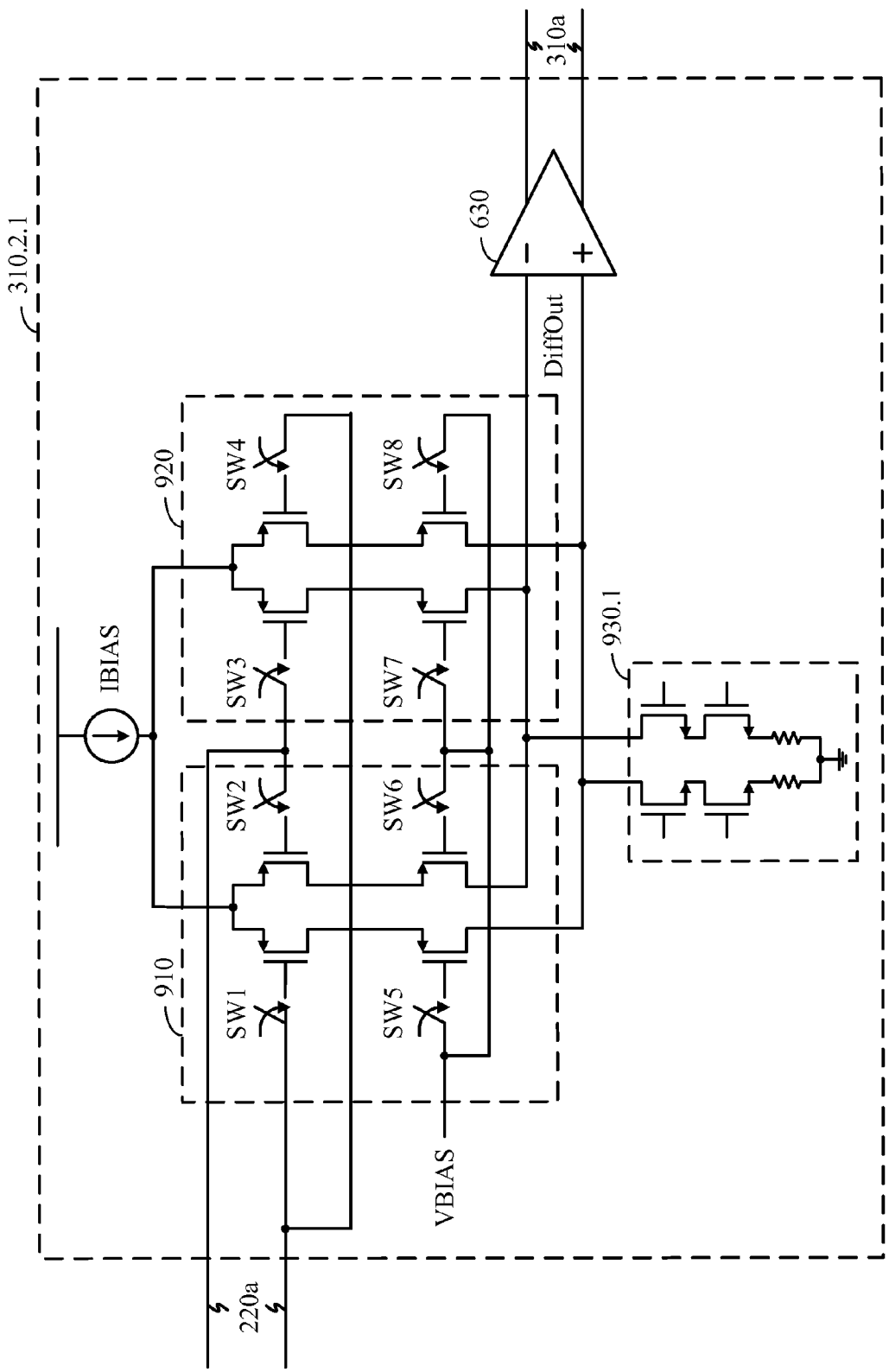
FIG. 9 illustrates an exemplary embodiment of a transistor-level implementation of a trans-impedance amplifier.

FIG. 9 illustrates an exemplary embodiment 310.2.1 of a transistor-level implementation for TIA 310.2. Note FIG. 9 is shown for illustrative purposes only, and is not meant to limit the scope of the present disclosure to any particular exemplary embodiment shown. Further note that feedback circuitry, e.g., corresponding to R5, C5, R6, and C6 in FIG. 7, is omitted from FIGS. 9, 10, and 11 hereinbelow for ease of illustration.

In FIG. 9, parallel-coupled bandwidth-selectable amplifiers are implemented with a first cascode input portion 910 and a second cascode input portion 920 coupled in parallel. A bias current source IBIAS is coupled to both portions 910, 920 to supply bias current thereto. Each of portions 910, 920 is further provided with a plurality of switches (e.g., SW1, SW2, SW5, SW6 for portion 910, and SW3, SW4, SW7, SW8 for portion 920) to functionally implement the switches described hereinabove with reference to FIG. 6 to select from either narrowband or wideband functionality for TIA 310.2.1. Per the techniques described hereinabove, the W and L parameters of the transistors in portions 910, 920 may each be appropriately chosen depending on whether the portion is designed for narrowband or wideband operation. Portions 910, 920 share a single load 930.1, and the differential output voltage DiffOut is coupled to a buffer amplifier 630 to generate differential signal 310a.

Figure 10:
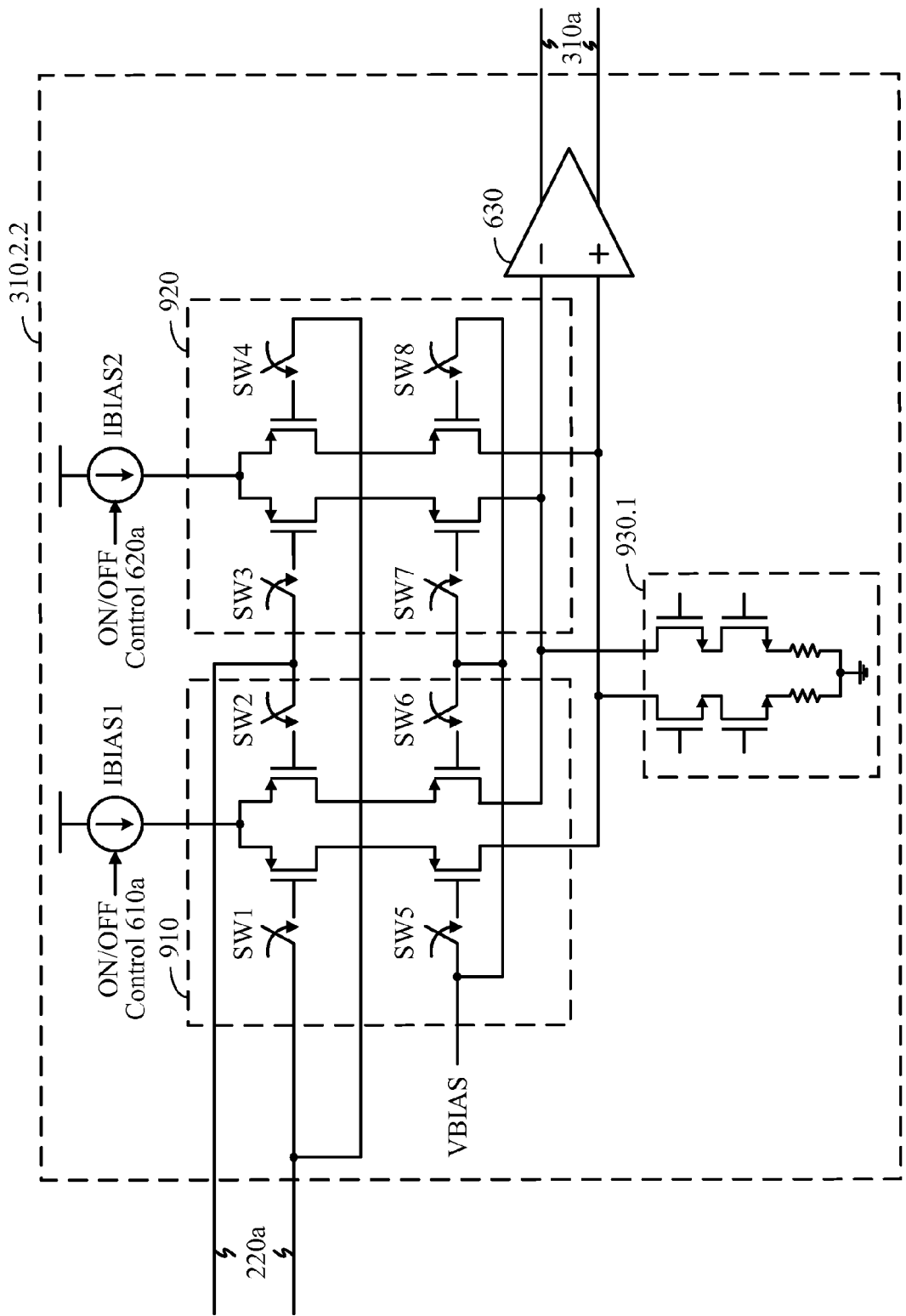
FIG. 10 illustrates an alternative exemplary embodiment of a trans-impedance amplifier.

FIG. 10 illustrates an alternative exemplary embodiment 310.2.2 of TIA 310.2. Note FIG. 10 is shown for illustrative purposes only, and is not meant to limit the scope of the present disclosure to any particular exemplary embodiment shown. In FIG. 10, TIA 310.2.2 includes two bias current sources IBIAS1, IBIAS2 coupled to portions 910, 920, respectively. It will be appreciated that separating the current sources in this manner may advantageously improve the common-mode rejection of the WB and/or NB amplifiers.

In the exemplary embodiment 310.2.2 shown, an ON/OFF control signal 610a is coupled to IBIAS1, and an ON/OFF control signal 620a is coupled to IBIAS2. It will be appreciated that turning the respective bias current sources on or off in accordance with the control signal settings advantageously provides a simple way to implement the bandwidth control signals 610a, 620a described hereinabove with reference to FIG. 6A. It will also be appreciated that, in certain alternative exemplary embodiments, the provision of such control signals to the bias current sources IBIAS1, IBIAS2 is optional, e.g., in exemplary embodiments wherein switches such as SW11, SW12, SW21, SW22 of FIG. 6 are provided to select the bandwidth. Such alternative exemplary embodiments are contemplated to be within the scope of the present disclosure.

Figure 11:
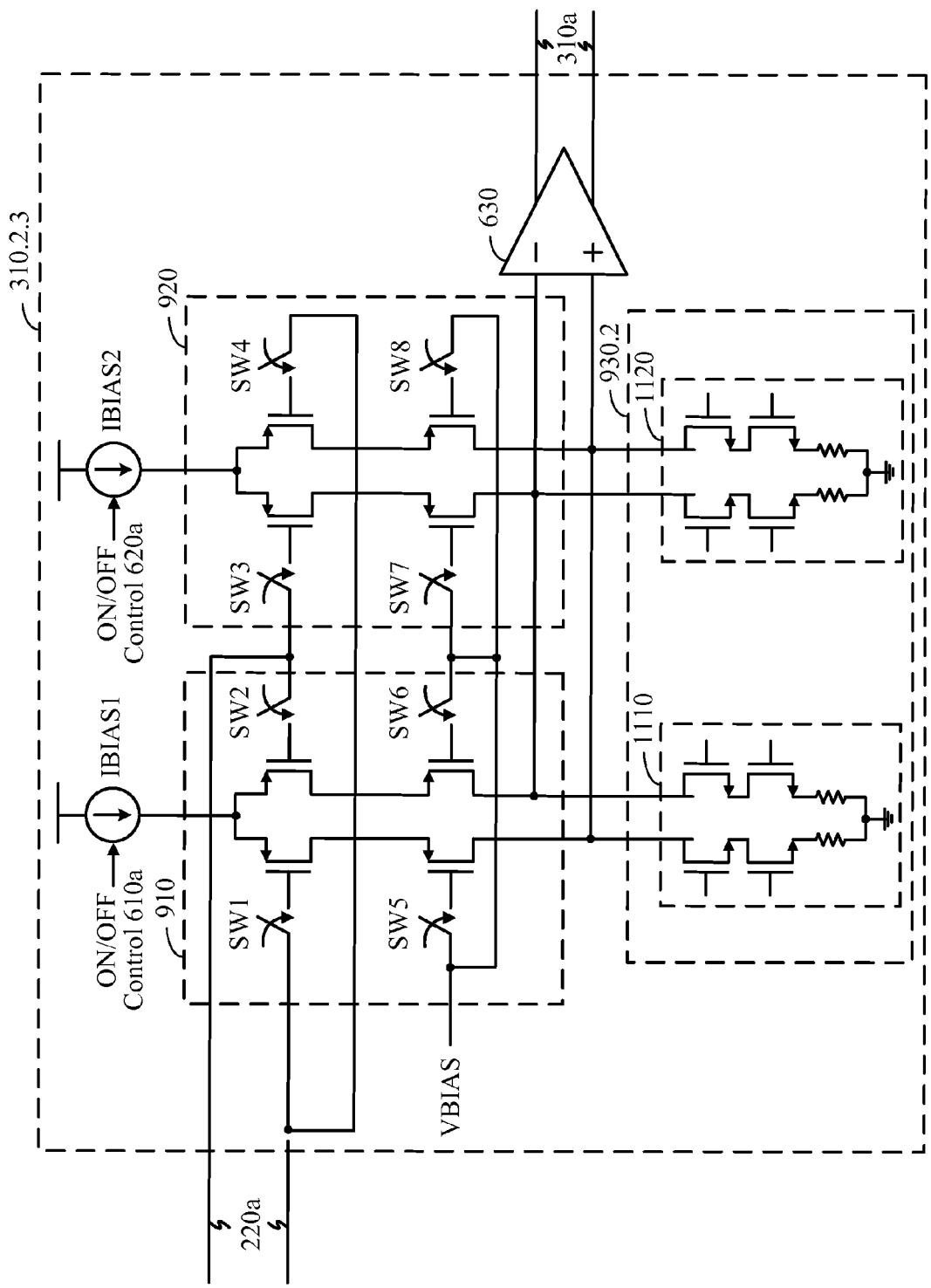
FIG. 11 illustrates a further exemplary embodiment of a trans-impedance amplifier.

FIG. 11 illustrates a further exemplary embodiment 310.2.3 of TIA 310.2. Note FIG. 11 is shown for illustrative purposes only, and is not meant to limit the scope of the present disclosure to any particular exemplary embodiment shown. In FIG. 11, TIA 310.2.3 includes a load 930.2 with separate active loads 1110, 1120 coupled to portions 910, 920, respectively. It will be appreciated that the provision of separate loads 1110, 1120 may advantageously afford more balanced gain characteristics between WB and NB modes of operation. Furthermore, providing separate active loads 1110, 1120 may advantageously reduce load parasitics for each portion, and improve bandwidth.

Note FIGS. 9, 10, and 11 are not meant to limit the scope of the present disclosure to the specific transistor-level topologies shown. One of ordinary skill in the art may readily modify the circuitry in TIA 310.2 using principles known in the art. For example, NMOS rather than PMOS input devices may be chosen, the input stage need not be a cascode stage but may simply be based on a common-source design, the amplifier may be configured using a "folded-cascode" topology known in the art, etc. Such alternative exemplary embodiments are contemplated to be within the scope of the present disclosure.

Figure 12:
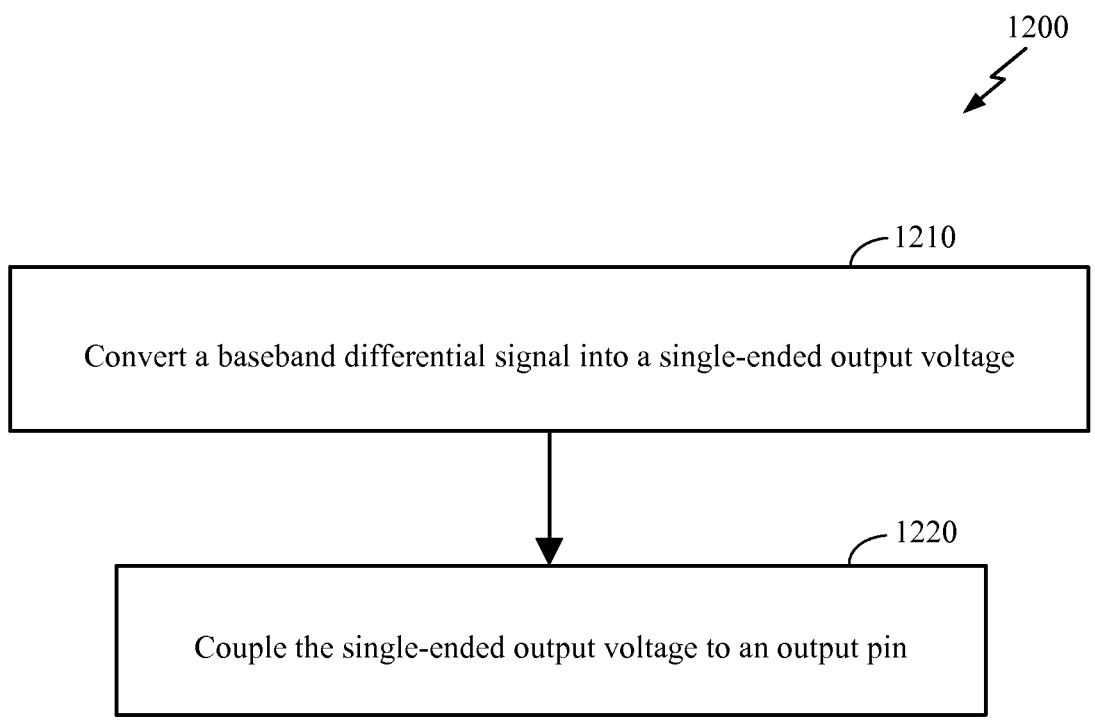
FIG. 12 illustrates an exemplary embodiment of a method according to the present disclosure.

FIG. 12 illustrates an exemplary embodiment of a method according to the present disclosure. Note FIG. 12 is not meant to limit the scope of the present disclosure to any particular method shown.

In FIG. 12, at block 1210, a baseband differential signal is converted into a single-ended output voltage.

At block 1220, the single-ended output voltage is coupled to an output pin.

Figure 13:
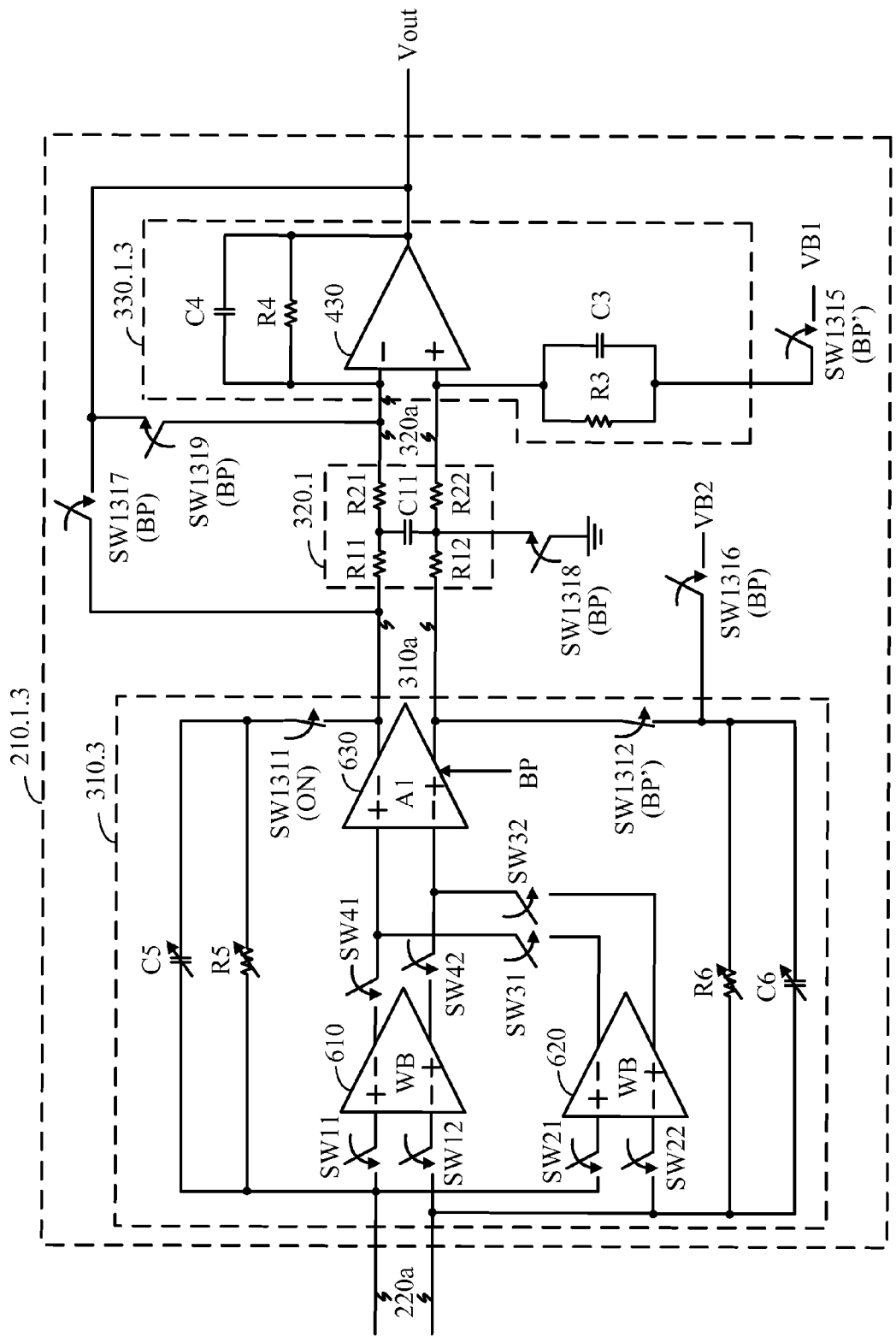
FIG. 13 illustrates an alternative exemplary embodiment of a converter incorporating techniques for bypassing an amplifier.

FIG. 13 illustrates an alternative exemplary embodiment 210.1.3 of a converter incorporating techniques for bypassing an amplifier. In the exemplary embodiment shown, an amplifier 330.1.3 of converter 210.1.3 may be selectively bypassed based on a control signal when not needed, e.g., to reduce unnecessary power consumption of converter 210.1.3. It will be appreciated that by providing a selectable bypass mode as described herein, converter 210.1.3 may advantageously be optimized for lower power consumption when the additional gain provided by amplifier 330.1.3 is not required.

In FIG. 13, converter 210.1.3 includes TIA 310.3 coupled to LPF 320.1, which is in turn coupled to amplifier 330.1.3. TIA 310.3 includes an amplifier (A1) 630, which is coupled to a bypass control signal BP. In certain exemplary embodiments, the bypass control signal BP may selectively turn amplifier 630 on or off. TIA 310.3 further includes a switch SW1311 coupling feedback circuitry R5/C5 to the negative (−) output terminal of amplifier 630, and a switch SW1312 coupling feedback circuitry R6/C6 to the positive (+) output terminal of amplifier 630.

In an exemplary embodiment, switch SW1311 may be an always-on (illustratively denoted "ON" in FIG. 13) switch that provides balancing characteristics to the differential signal path of TIA 310.3. Switch SW1312 is controlled by the inverse BP' of bypass control signal BP. In particular, switch SW1312 may be closed when BP' is "true" or "high" (and BP is "false" or "low"), and opened when BP' is "false" or "low" (and BP is "true" or "high").

As further shown in FIG. 13, converter 210.1.3 further includes a switch SW1317 selectively coupling an output terminal of TIA 310.3 directly to the output voltage Vout of converter 210.1.3. Switch SW1317 is controlled by BP. In particular, switch SW1317 may be closed when BP is true, and opened when BP is low. Converter 210.1.3 further includes a switch SW1315 coupling parallel RC circuit R3/C3 of amplifier 330.1.3 to the bias voltage VB1. Switch SW1315 is controlled by BP'. In particular, switch SW1315 may be closed when BP' is high, and opened when BP' is low.

It will be appreciated that by closing SW1317 (and further configuring the other bypass switches as described hereinabove), a single output of the fully differential TIA 310.3 is directly coupled to the single-ended output voltage Vout of converter 210.1.3. In certain exemplary embodiments utilizing this technique, techniques for improving the common-mode rejection of TIA 310.3 (e.g., improved common-mode feedback techniques) known in the art may be utilized, to maintain the common-mode noise in Vout at an acceptable level. Alternatively, in certain exemplary embodiments wherein common-mode rejection requirements of the receiver are relaxed, then no explicit techniques for improving common-mode rejection of TIA 310.3 need be utilized. Such alternative exemplary embodiments are contemplated to be within the scope of the present disclosure.

Per the techniques described hereinabove, converter 210.1.3 may be configured to selectively bypass amplifier 330.1.3 by setting bypass control signal BP, and accordingly, BP'. For example, when BP is set "high," indicating bypass mode is turned on, then the negative (−) output terminal of amplifier 630 is directly coupled to the output voltage Vout of converter 210.1.3. In support of this mode, SW1312 is opened to decouple the feedback circuitry R6/C6 from amplifier 630, with R6/C6 instead coupled to a fixed bias voltage VB2. Furthermore, SW1315 decouples parallel RC circuit R3/C3 from the bias voltage VB1. Alternatively, when BP is set "low," indicating bypass mode is turned off, then the converter 210.1.3 is configured to function similarly to, e.g., converter 210.1.2 shown in FIG. 7. In an exemplary embodiment, VB1 and VB2 may correspond to the same voltage.

Further shown in FIG. 13 are switches SW1318, SW1319 that may be selectively configured to couple a single-ended output of LPF 320.1 to the single-ended output voltage Vout of converter 210.1.3. In particular, in a bypass mode, SW1319 may be closed (and SW1317 may be opened) to couple an output of LPF 320.1 to the single-ended output voltage Vout. Furthermore, SW1318 may be closed to selectively ground another terminal of LPF 320.1 to ground.

It will be appreciated that not all bypass switches (e.g., switches controlled by the bypass control signal "BP" in FIG. 13) need be simultaneously provided in all exemplary embodiments. For example, alternative exemplary embodiments may incorporate only a subset of such bypass switches, e.g., omitting SW1317 altogether. Furthermore, alternative exemplary embodiments need not configure amplifier A1 630 to be selectively enabled or disabled by control signal BP. Such alternative exemplary embodiments are contemplated to be within the scope of the present disclosure.

Further note that the indications of the particular bypass control signals (e.g., BP or BP') coupled to switches in FIG. 13 are shown for illustrative purposes only, and are not meant to restrict the scope of the present disclosure to any particular manner of controlling the switches shown. In alternative exemplary embodiments, the bypass switches may be alternatively configured during one or more modes in which amplifier 330 is bypassed. For example, in a first alternative exemplary embodiment of bypass mode, SW 1316 is closed, SW 1312 is opened, SW1318 is closed, SW 1315 is opened, and either SW1317 or SW 1319 is closed. In a second alternative exemplary embodiment of bypass mode, SW 1316 is opened, SW1312 is closed, SW1318 is opened, SW1315 is opened, and either SW1317 or SW 1319 is closed. Such alternative exemplary embodiments of bypass mode are contemplated to be within the scope of the present disclosure.

In an exemplary embodiment, converter 210.1.3 may be designed to be coupled to a "voltage-mode" passive mixer, e.g., a voltage-mode passive version of mixer 220 described hereinabove, at the input to converter 210.1.3. In particular, in certain applications wherein requirements for receiver linearity, e.g., as determined by a second-order input intercept point (or "IIP2"), may be relaxed, then the bypass mode afforded by converter 210.1.3 may advantageously provide single-ended output signals for the receiver while maintaining acceptable performance. For example, in a receiver for a Global Positioning System (or "GPS"), IIP2 may be dominated by out-of-band jammers that are attenuated at the LNA output, and thus voltage-mode mixers may be combined with the differential-to-single-ended converter 210.1.3 to yield a robust receiver with single-ended output pins, as the impact on receiver performance due to mixer output loading imbalance by converter 210.1.3 may in such cases be negligible.

In an exemplary embodiment, the techniques of the present disclosure may be applied to receivers supporting any types of technologies, e.g., wireless specifications for wide-area networks (WAN's), local area networks (LAN's), GPS, etc.

Figure 14:
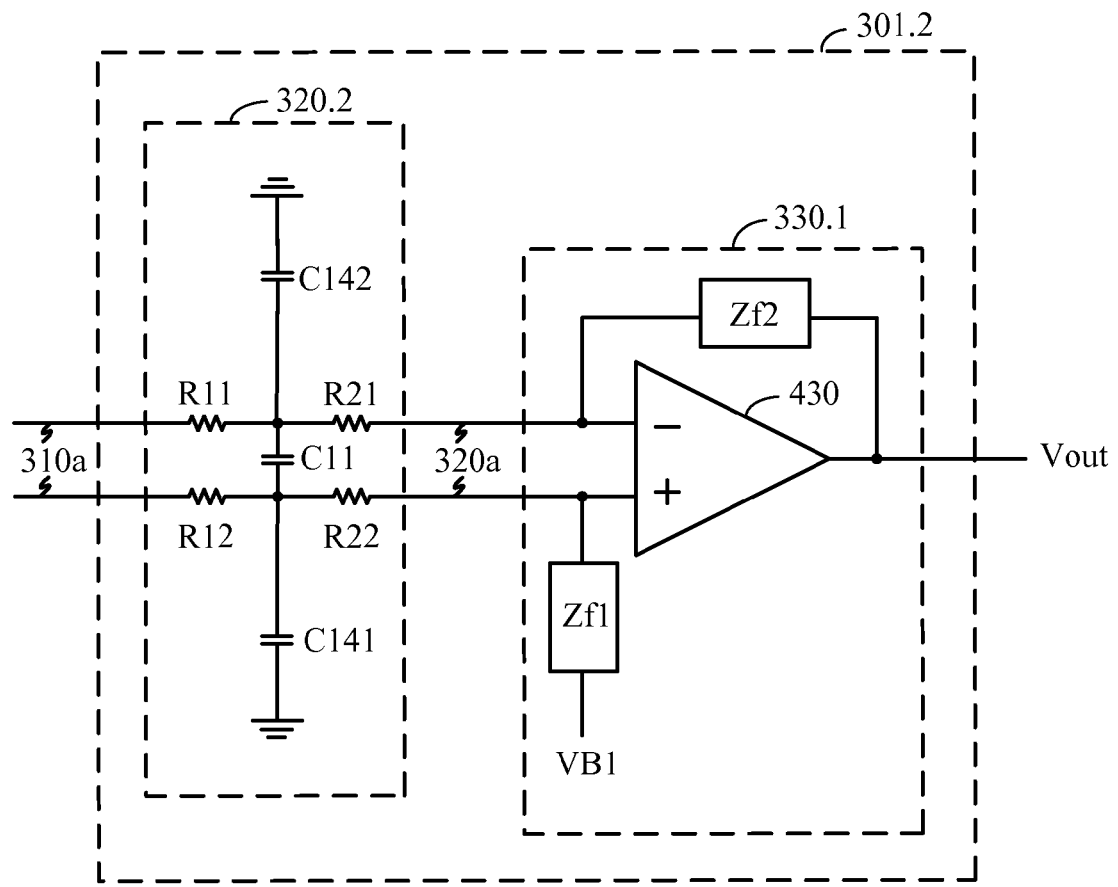
FIG. 14 illustrates an alternative exemplary embodiment of a processing block.

FIG. 14 illustrates an alternative exemplary embodiment 301.2 of processing block 301. Processing block 301.2 includes an LPF 320.2 and amplifier 330.1, with LPF 320.2 further including capacitors C141, C142 coupling single-ended terminals of C11 to ground. In an exemplary embodiment, the values of C141 and C142 may be equal to each other. In an alternative exemplary embodiment (not shown), C11 may be omitted from LPF 320.2.

Figure 15:
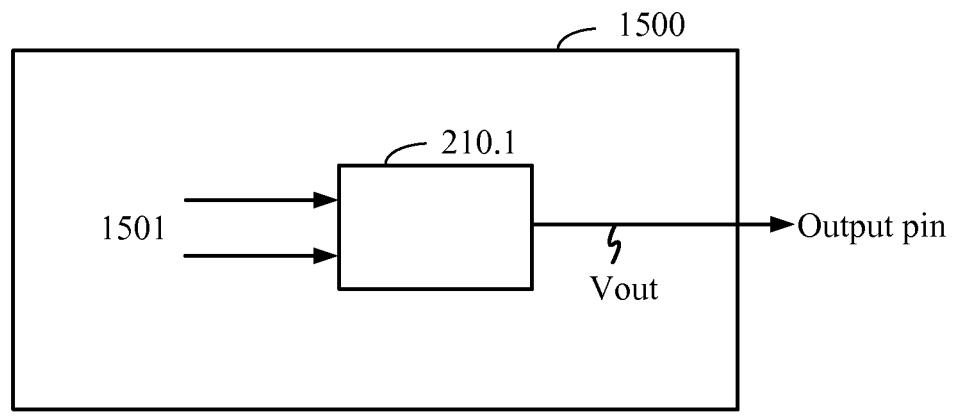
FIGS. 15 and 16 illustrate alternative exemplary embodiments of apparatuses according to the present disclosure.

FIG. 15 illustrates an alternative exemplary embodiment 1500 of an apparatus according to the present disclosure. In FIG. 15, apparatus 1500 includes a baseband amplifier 210.1 configured to convert a differential signal 1501 into a single-ended output voltage Vout, and an output pin coupled to the single-ended output voltage.

Figure 16:
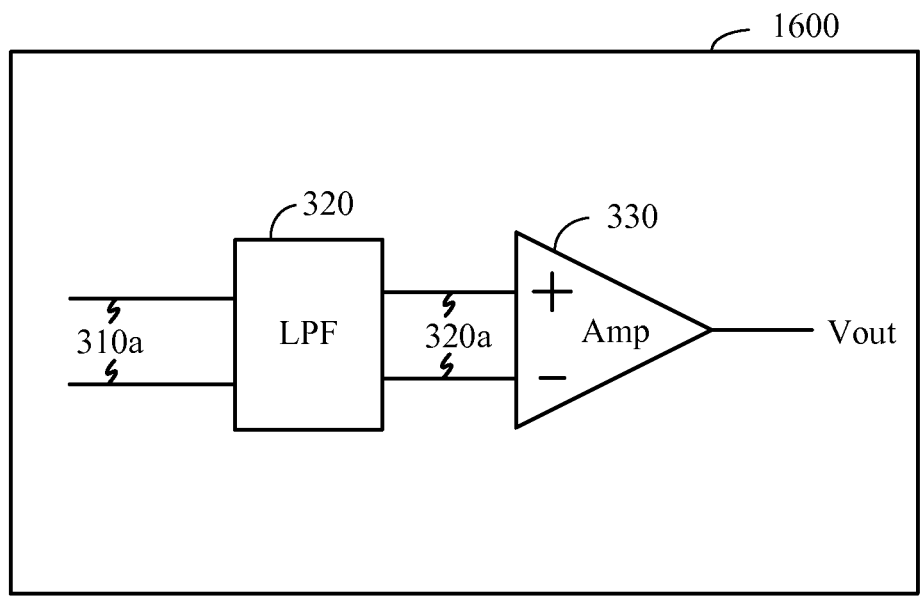

FIG. 16 illustrates an alternative exemplary embodiment 1600 of an apparatus according to the present disclosure. In FIG. 16, apparatus 1600 includes a low-pass filter 320 configured to filter a differential signal 310*a* to generate a first differential voltage 320*a*, and an amplifier (Amp) 330 configured to generate a single-ended output voltage Vout from the first differential voltage 320*a*.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
    a baseband amplifier configured to convert a differential current signal into a single-ended output voltage, the baseband amplifier comprising a trans-impedance amplifier configured to generate a first differential voltage from the differential current signal, the trans-impedance amplifier having a bandwidth selectable from a first band and a second band; and
    an output pin coupled to the single-ended output voltage.

2. The apparatus of claim 1, the baseband amplifier further comprising:
    a low-pass filter configured to filter the first differential voltage to generate a second differential voltage; and
    an amplifier configured to generate the single-ended output voltage from the second differential voltage.

3. The apparatus of claim 2,
    the trans-impedance amplifier further comprising a differential amplifier configured to generate the first differential voltage from the differential current signal; and
    the low-pass filter further comprising capacitors coupling single-ended terminals of the low-pass filter to ground.

4. The apparatus of claim 3, the trans-impedance amplifier comprising narrowband amplifiers and wideband amplifiers, wherein each of the narrowband amplifiers and each of the wideband amplifiers comprise a transistor input stage, and wherein an area of NB a narrowband amplifier transistor input stage is larger than an area of a wideband amplifier WB transistor input stage.

5. The apparatus of claim 4, further comprising:
    a single current source coupled to the narrowband amplifier transistor input stage and to the wideband amplifier transistor input stage; and
    a single load coupled to the narrowband amplifier transistor input stage and to the wideband amplifier transistor input stage.

6. The apparatus of claim 4, further comprising:
    a first current source coupled to the narrowband amplifier transistor input stage, the first current source configurable to be turned on or off in response to a first control signal setting;
    a second current source coupled to the wideband amplifier transistor input stage, the second current source configurable to be turned on or off in response to a second control signal setting;
    a first load coupled to the narrowband amplifier transistor input stage; and
    a second load coupled to the wideband amplifier transistor input stage.

7. The apparatus of claim 2, further comprising a plurality of switches to selectively bypass the amplifier that is configured to generate the single-ended output voltage from the second differential voltage.

8. The apparatus of claim 7, the plurality of switches comprising a switch selectively coupling a single-ended voltage of the first differential voltage directly to the single-ended output voltage of the baseband amplifier.

9. The apparatus of claim 7, the plurality of switches comprising:

a first switch selectively coupling a first single-ended voltage of the low-pass filter directly to the single-ended output voltage of the baseband amplifier;

a second switch selectively coupling a second single-ended voltage of the low-pass filter to ground.

10. The apparatus of claim 1, wherein the baseband amplifier is an in-phase baseband amplifier, and wherein the single-ended output voltage is an in-phase output voltage, the apparatus further comprising:
- a quadrature baseband amplifier configured to convert a second differential current signal into a single-ended quadrature output voltage; and
- a quadrature output pin coupled to the single-ended quadrature output voltage.

11. The apparatus of claim 1, wherein the trans-impedance amplifier comprises a feedback network having a selectively configurable resistance or a selectively configurable capacitance.

12. The apparatus of claim 1, wherein the baseband amplifier has a selectively configurable frequency response.

13. The apparatus of claim 1, further comprising a current-mode passive mixer having an output coupled to the differential current signal of the baseband amplifier.

14. The apparatus of claim 1, further comprising:
- an in-phase baseband amplifier for each carrier of a carrier aggregation system; and
- a quadrature baseband amplifier for each carrier of the carrier aggregation system, wherein the baseband amplifier is associated with a first carrier of the carrier aggregation system.

15. The apparatus of claim 1, wherein the first band includes a narrowband, and wherein the second band includes a wideband.

16. An apparatus comprising:
- a low-pass filter configured to filter a differential signal to generate a first differential voltage;
- an amplifier configured to generate a single-ended output voltage from the first differential voltage; and
- a plurality of switches to selectively bypass the amplifier that is configured to generate the single-ended output voltage from the first differential voltage.

17. The apparatus of claim 16, the low-pass filter comprising:
- resistors coupled in series between nodes of the differential signal and the first differential voltage; and
- at least one capacitor coupling a first resistor of the resistors to a second resistor of the resistors.

18. The apparatus of claim 17, wherein the at least one capacitor includes a first programmable element having a first configurable impedance, and wherein at least one resistor of the resistors includes a second programmable element having a second configurable impedance.

19. The apparatus of claim 18, the low-pass filter comprising a resistive-capacitive network, the amplifier comprising positive and negative input terminals, wherein a negative input terminal of the amplifier is coupled to a first bias voltage by a first impedance, and wherein a positive input terminal of the amplifier is coupled to the single-ended output voltage by a second impedance.

20. The apparatus of claim 16, the plurality of switches comprising a switch selectively coupling a single-ended voltage of the first differential voltage directly to the single-ended output voltage of the amplifier.

21. The apparatus of claim 16, the plurality of switches comprising:
- a first switch selectively coupling a first single-ended voltage of the low-pass filter directly to the single-ended output voltage of the amplifier; and
- a second switch selectively coupling a second single-ended voltage of the low-pass filter to ground.

22. An apparatus comprising:
- means for converting a baseband differential current signal into a single-ended output voltage, the means for converting comprising means for generating a first differential voltage from the differential current signal, the means for generating the first differential voltage having a bandwidth selectable from a first band and a second band; and
- means for coupling the single-ended output voltage to an output pin.

23. The apparatus of claim 22, the means for converting further comprising:
- means for filtering the first differential voltage to generate a second differential voltage; and
- means for generating the single-ended output voltage from the second differential voltage.

24. An apparatus comprising:
- means for filtering a differential signal to generate a first differential voltage;
- means for generating a single-ended output voltage from the first differential voltage; and
- means for selectively bypassing the means for generating the single-ended output voltage.

25. The apparatus of claim 24, the means for filtering comprising means for selecting a bandwidth of the filtering.

* * * * *